(12) United States Patent
Ohe et al.

(10) Patent No.: US 6,256,876 B1
(45) Date of Patent: Jul. 10, 2001

(54) METHOD AND DEVICE FOR MOUNTING ELECTRONIC COMPONENTS

(75) Inventors: Kunio Ohe, Hirakata; Ryoji Inutsuka, Osaka; Keiji Hanada, Hirakata; Naomi Nishi, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 08/973,094

(22) PCT Filed: Jun. 6, 1996

(86) PCT No.: PCT/JP96/01529

§ 371 Date: Mar. 10, 1998

§ 102(e) Date: Mar. 10, 1998

(87) PCT Pub. No.: WO96/42189

PCT Pub. Date: Dec. 27, 1996

(30) Foreign Application Priority Data

Jun. 13, 1995 (JP) .................................................. 7-146128

(51) Int. Cl.⁷ ............................................................ H05K 3/30
(52) U.S. Cl. ................................ 29/832; 29/740; 29/739; 29/833; 29/721
(58) Field of Search ............................ 29/739, 740, 741, 29/833, 832, 840; 324/158 F, 158 P

(56) References Cited

U.S. PATENT DOCUMENTS

| | | | |
|---|---|---|---|
| 4,573,262 | * 3/1986 | Dornes et al. ........................ 29/739 |
| 4,998,207 | * 3/1991 | Postlewait ..................... 364/474.08 |
| 5,003,254 | * 3/1991 | Hunt ................................. 324/158 F |
| 5,084,959 | * 2/1992 | Andos .................................... 29/740 |
| 5,166,492 | * 11/1992 | Rivera .............................. 219/121.68 |
| 5,209,131 | * 5/1993 | Baxter ................................ 73/865.8 |
| 5,383,270 | * 1/1995 | Iwatsuka et al. ..................... 29/840 |
| 5,443,534 | * 8/1995 | Vinciarelli et al. ................... 29/593 |
| 5,924,192 | * 7/1999 | Wuyt ..................................... 29/833 |

FOREIGN PATENT DOCUMENTS

| | | |
|---|---|---|
| 59-50503 | 3/1984 | (JP) . |
| 60-175445 | 9/1985 | (JP) . |
| 6-216570 | 8/1994 | (JP) . |
| WO 93/24945 | 9/1993 | (WO) . |

* cited by examiner

Primary Examiner—Lee Young
Assistant Examiner—Sean Smith
(74) Attorney, Agent, or Firm—McDermott, Will & Emery

(57) ABSTRACT

The present invention concerns a method and apparatus of automatically mounting electronic components at predetermined positions of an electronic circuit board, which comprise a mounting process of taking out an electronic component 10 from an electronic components holding unit 6 and mounting onto an electronic circuit board 5 and a processing process to trim the electronic component 10 during the mounting process to a preferable characteristic value thereby allowing to reduce the number of types of electronic components 10 to be stored in the electronic components holding unit 6 and reduce the equipment cost and the management cost of the electronic components 10.

23 Claims, 5 Drawing Sheets

METHOD AND DEVICE FOR MOUNTING ELECTRONIC COMPONENTS

FIELD OF THE INVENTION

This invention relates to a method of automatically mounting electronic components at predetermined positions of an electronic circuit board and an apparatus therefor.

BACKGROUND OF THE INVENTION

Referring to FIG. 6, a typical example of conventional electronic components mounting apparatus will be explained. In FIG. 6, an orthogonal robot 31 moves a mounting head 32 to an arbitrary position in x and y directions. On the tip of the mounting head 32 is provided a suction nozzle 33 which can be moved up and down. A chuck may be used in place of the suction nozzle 33.

A circuit board holder 34 holds at a predetermined position an electronic circuit board 35 supplied from outside the apparatus. An electronic components holding unit 36 stores electronic components to be mounted on the electronic circuit board 35. On the electronic components holding unit 36, a plurality of electronic component supplying cassettes 37 is arranged in a line.

In the above construction, when an electronic component is to be mounted, the mounting head 32 first moves to the electronic components holding unit 36, picks up an electronic component from an preferable electronic component supplying cassette 37 on the electronic components holding unit 36 by means of the suction nozzle 33; subsequently the mounting head 32 moves to the circuit board holder 34 and mounts the electronic component at a predetermined position on the pre-positioned electronic circuit board 35.

In the above described conventional electronic components mounting apparatus, as the number of types of electronic components to be mounted on the electronic circuit board 35 increases the number of the electronic component supplying cassettes 37 to be arranged on the electronic components holding unit increases making it necessary to either install more than one unit of electronic components mounting apparatus or a larger-capacity electronic components mounting apparatus.

In the meantime, there exist different types of electronic components such as chip resistors which are the same in construction, configuration, and dimensions yet have different characteristic values. In the conventional method, it has been necessary to cope with such situation by arranging on the electronic components holding unit 36 an electronic component supplying cassette 37 for each of the component types. It was thus sometimes necessary to install more than one main units or a larger-size main unit of the mounting apparatus resulting in increase in equipment cost and the management cost of electronic component supplying cassettes.

SUMMARY OF THE INVENTION

The present invention addresses the problems associated with the conventional method and provides a method and apparatus of electronic components mounting with which the number of electronic component supplying cassettes to be arranged on the electronic components holding unit can be reduced to less than the number of types of components thus decreasing the equipment cost and the management cost of the electronic component supplying cassettes.

The electronic components mounting method in accordance with the present invention consists of a mounting process in which an electronic component is picked up from the electronic components holding unit and is mounted on an electronic circuit board, and a processing process to trim the electronic component to a preferable characteristic value within the mounting process.

In a preferred embodiment of the present invention, an electronic component is trimmed by a laser beam while its characteristic value is being measured or while its trimming position is being observed by an image recognition device.

The electronic components mounting apparatus in accordance with the present invention comprises an electronic components holding unit which stores electronic components, a circuit board holder to hold an electronic circuit board, a mounting head which picks up an electronic component and mounts it at a predetermined position on the electronic circuit board, and a laser trimming unit to trim the electronic component until a preferable characteristic value is obtained.

In a further preferred embodiment of the present invention, the laser trimming unit is provided with a measuring means to measure the characteristic values of electronic components, a laser oscillation means, a laser scanning means to change the position of laser beam irradiation, an image pick up means to pick up the image of electronic components, and a control unit to control the position of laser beam irradiation based on the picked up image. Also, the electronic components holding unit has a plurality of electronic component supplying cassettes arranged in a line, and the laser trimming unit is so provided that it can be moved to the upper part of the electronic components holding unit in the direction along which the electronic component supplying cassettes are arranged.

By employing the method and apparatus for electronic components mounting in accordance with the present invention, it is possible to decrease the number of the electronic component supplying cassettes to be arranged on the electronic components holding unit by being able to trim electronic components to preferable characteristic values within the mounting process of the electronic components thereby allowing to reduce the number of electronic component supplying cassettes and hence reducing the equipment cost and management cost of the electronic component supplying cassettes.

BEST MODE FOR THE IMPLEMENTATION OF THE PRESENT INVENTION

Figure 1:
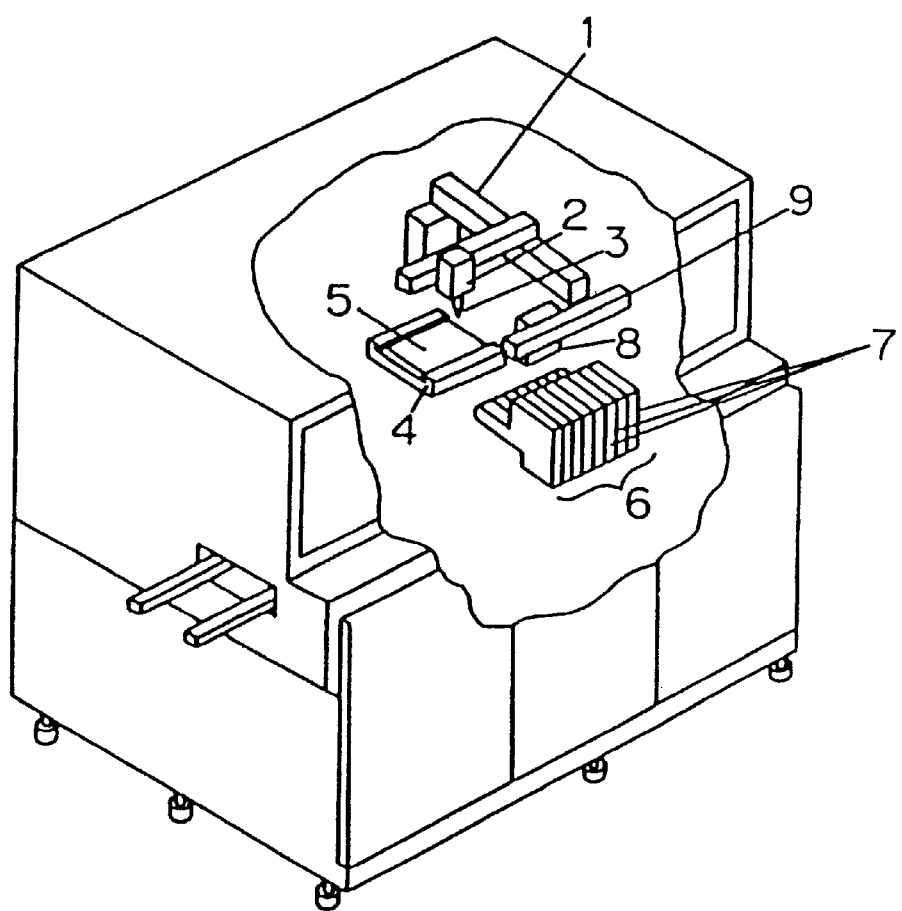
FIG. 1 is a partially cutaway perspective view of the electronic components mounting apparatus in accordance with an exemplary embodiment of the present invention.
Figure 2:
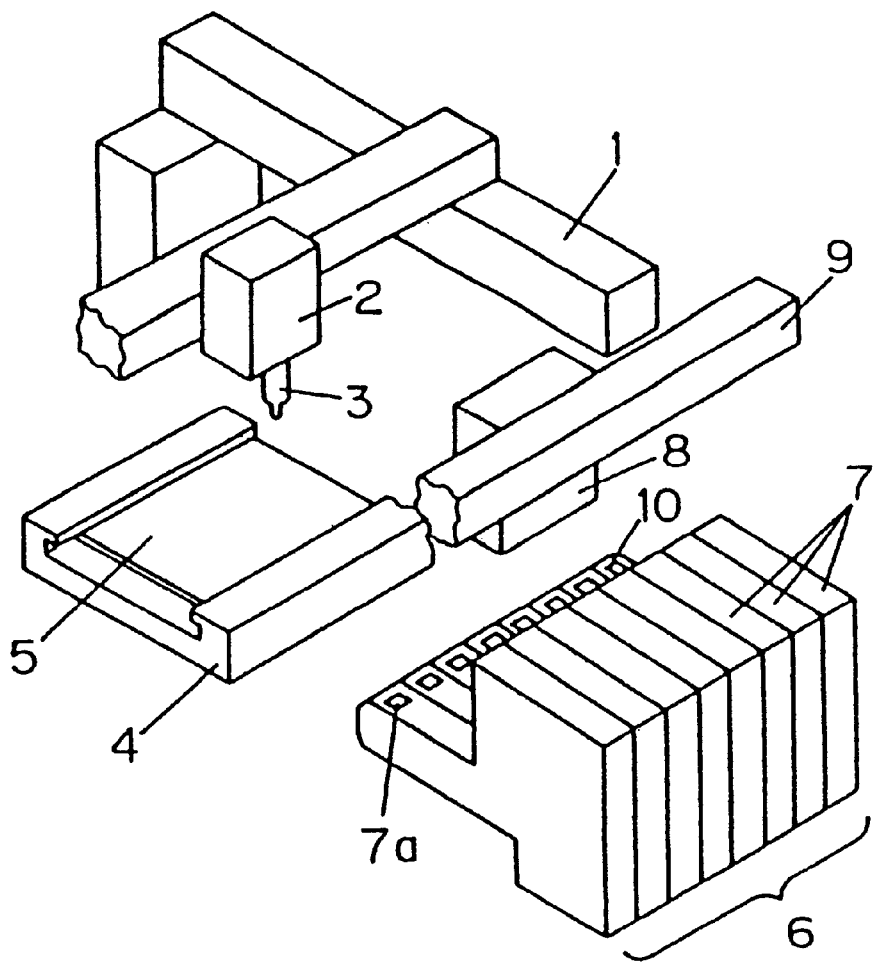
FIG. 2 is a schematic perspective view of key parts in accordance with an exemplary embodiment of the present invention.
Figure 3:
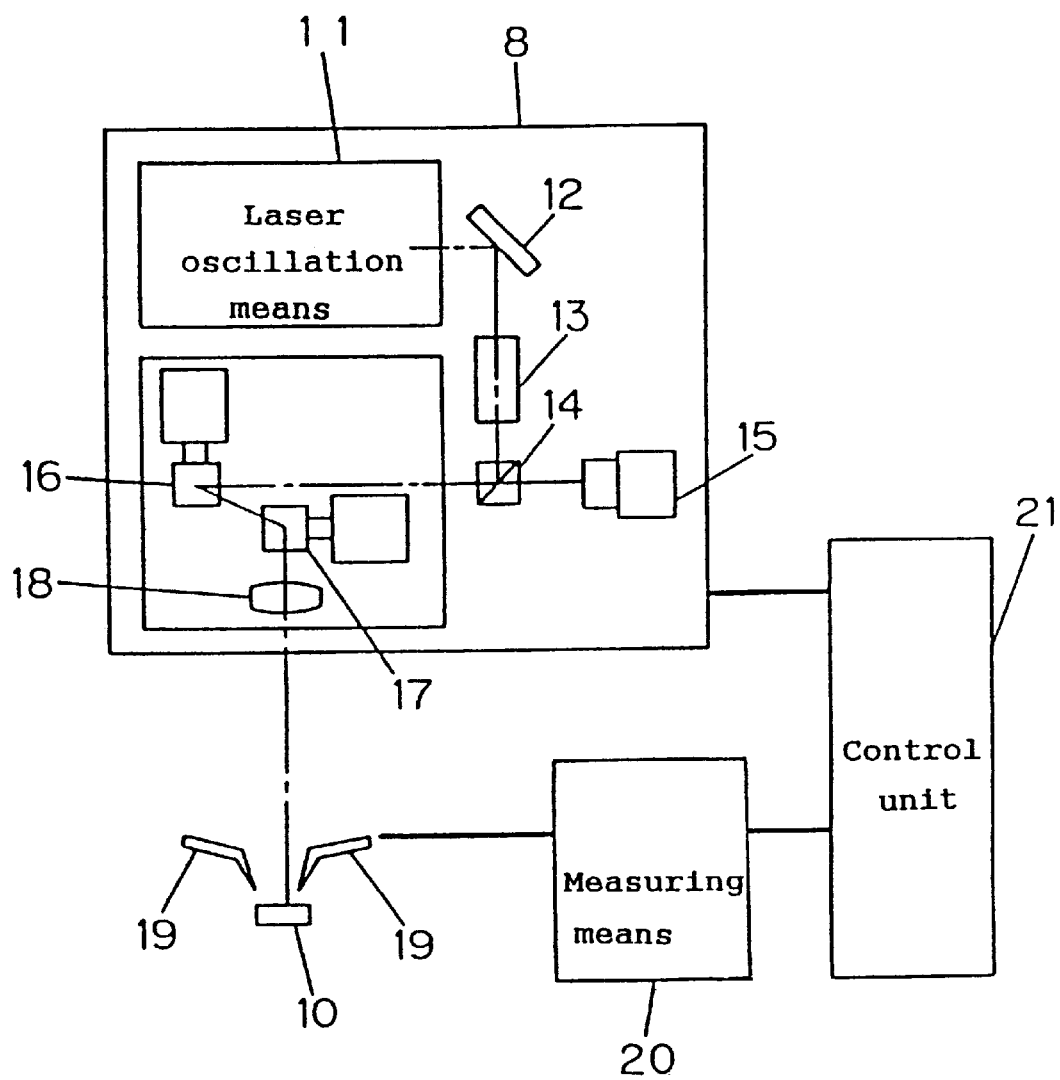
FIG. 3 is a schematic construction of the laser trimming unit in accordance with an exemplary embodiment of the present invention.

Referring to FIGS. 1 to 3 an exemplary embodiment of the electronic components mounting apparatus in accordance with the present invention will be explained in the following.

In FIGS. 1 and 2, an orthogonal robot 1 supports a mounting head 2 in such a way that it can move in the x and y directions. On the mounting head 2 a suction nozzle 3 which sucks and holds an electronic component is provided in such a way that it can be moved up and down. A circuit board holder 4 holds at a predetermined position an electronic circuit board 5 supplied from outside of the apparatus after positioning it. An electronic components holding unit 6 has a plurality of electronic component supplying cassettes 7 arranged in a line in the X direction in such a way that any one of them can be detached. A laser trimming head 8 is supported by a positioning unit 9 in such a way that it can move in the x direction along the upper part of the electronic components holding unit 6. An electronic component 10 is stored in one of the electronic component supplying cassettes 7 and is of a type such as a laser trimmable chip resistor of which the characteristic value can be changed by laser trimming.

As shown in FIG. 3, the laser trimming head 8 comprises a laser oscillation means 11 having laser irradiation on-off function, a mirror 12, a laser focus adjusting means 13, a half mirror 14, a video camera 15, an X-axis scanning mirror 16, a Y-axis scanning mirror 17, and a lens 18. There is also a provision to measure characteristic value of the electronic component 10 by means of probes 19 and a measurement means 20. A control unit 21 controls laser oscillation, switching on and off of laser irradiation, laser focus adjustment, X-axis scanning mirror drive, Y-axis scanning mirror drive, probe motion, measurement means, and image processing, and has a memory unit, an arithmetic logic unit, and a data input-output unit.

Next, electronic components mounting operation of the above described structure will be explained.

(1) Position and hold a supplied electronic circuit board 5 on the circuit board holder 4.

(2) The laser trimming head 8 moves to above the electronic component 10 which Is to be mounted first on the electronic circuit board 5.

(3) Pick up a surface image of the electronic component 10 with the video camera 15 through the lens 18, Y-axis scanning mirror 17, X-axis scanning mirror 16, and half mirror 14.

(4) Determine by the control unit 21 the starting position of laser irradiation and laser scanning path based on the recognized image of the electronic component 10 and the predetermined conditions.

(5) Based on the preset thickness of the electronic component 10, set the laser focus adjustment means 13 so that laser irradiation focuses on the surface of the electronic component 10.

(6) Move the probes 19 to the electrodes of the electronic component 10 and measure the characteristic value by means of the measuring unit 20.

(7) By controlling the laser oscillation means 11, X-axis scanning mirror 16, and Y-axis scanning mirror 17, trim the electronic component 10 with laser irradiation until a preset characteristic value is obtained.

(8) When trimming is complete, move the laser trimming head 8 to a position not interfering with the mounting head 2.

(9) Pick up from the electronic component supplying cassette 7 the trimmed electronic component 10 by sucking with the suction nozzle 3 of the mounting head 2, and transfer it by moving the mounting head 2 to a predetermined position on the electronic circuit board 5.

(10) By repeating the motions described in (2) through (9) above, mount all of the electronic components 10 which are to be mounted on the electronic circuit board 5.

Figure 4:
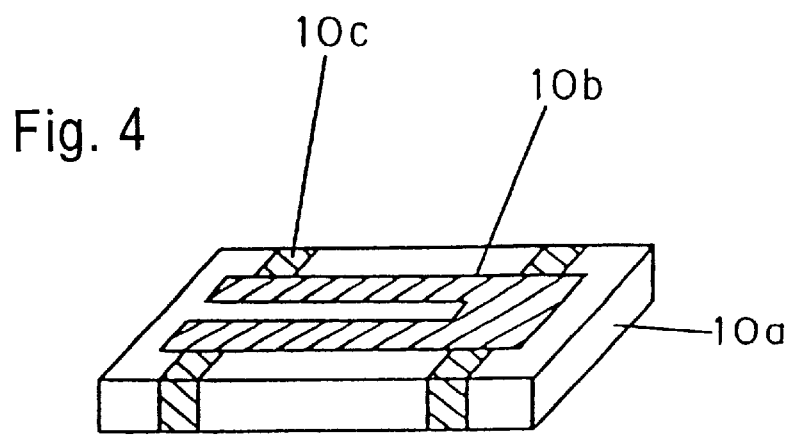
FIG. 4 is a perspective view of a trimmed resistor to be used in an exemplary embodiment of the present invention.
Figure 5:
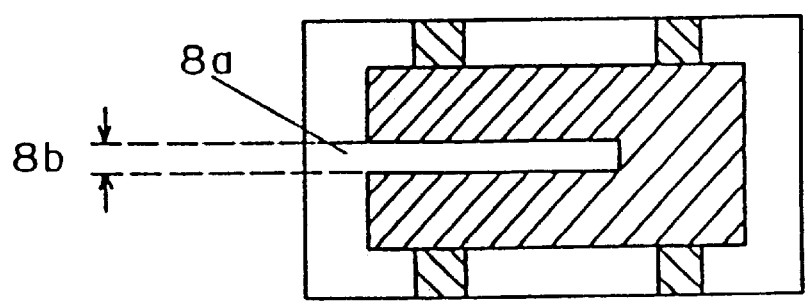
FIG. 5 is a plan view of a trimmed resistor to be used in an exemplary embodiment of the present invention.
Figure 6:
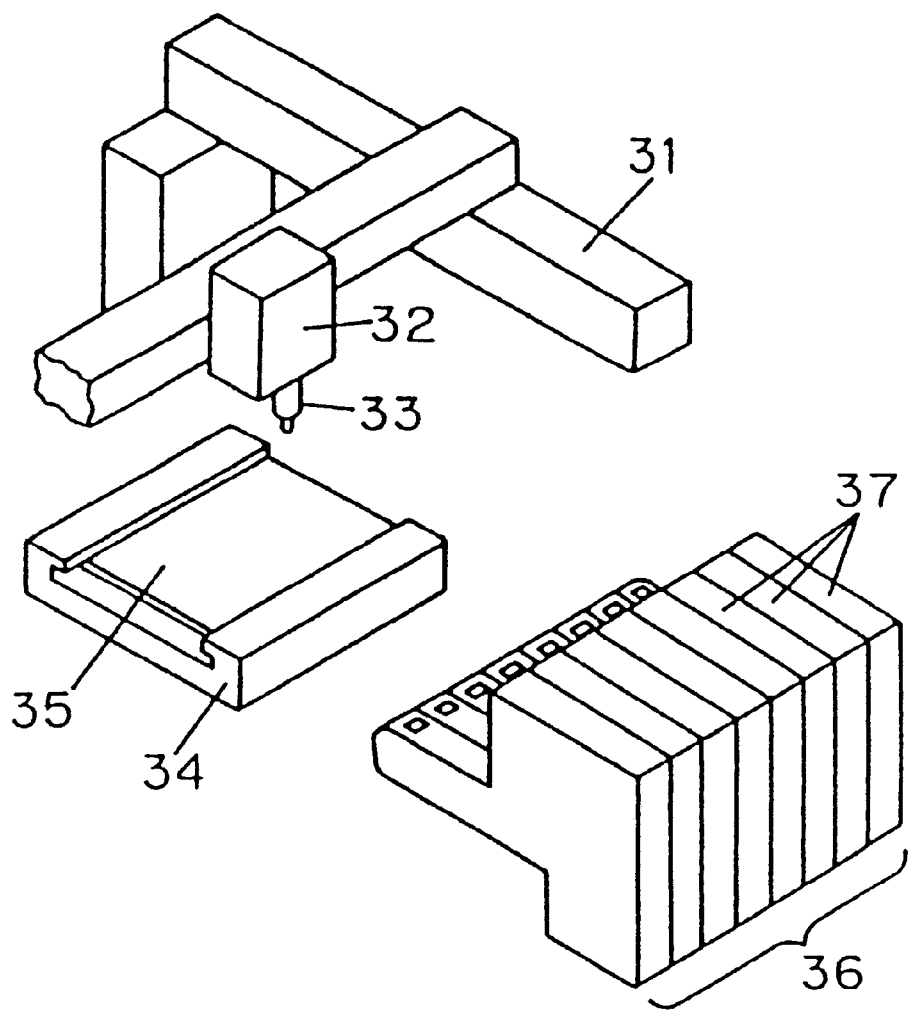
FIG. 6 is a schematic perspective view of a conventional electronic components mounting apparatus.

To describe more specifically, a supplied electronic circuit board 5 is positioned and held on the circuit board holder 4 and the laser trimming head 8 is moved to above the electronic component 10 at the component supplying port 7a of the electronic component supplying cassette 7. Here the electronic component 10 is a trimmable resistor 10d as shown in FIG. 4 made by coating resistive material 10b on an alumina substrate 10a and providing electrodes 10c at both ends. The dimension of the trimmable resistor 10d is 3.2 mm in length, 1.6 mm in width, and 0.6 mm in thickness while its initial resistance is 1 kohm. Optimum condition for trimming with a laser beam of 1.06 mm wavelength is a laser spot diameter of 0.05 mm at the surface of the resistor, total irradiation energy of 1.2 watts, and laser scanning speed of 10 mm/sec. The trimmable resistor 10d can be of a type in which surface of the resistive material 10b is provided with glass passivation.

A surface image of the trimmable resistor is picked up with the video camera 15 incorporated in the laser trimming unit, and the contour of the resistive material 10b is extracted from the recognized image of the trimmable resistor 10d. Then after disposing the trimmable resistor 10d on the component supplying port 7a, the slant of the center line of the trimming groove on the resistive material 10b is calculated. Taking this slant of the trimming groove into account, the starting position 8a of laser irradiation for trimming off the resistive material 10b (or for cutting a trimming groove) and the path for laser scanning are determined. After setting the trimming conditions in this way, a part of the resistive material 10b of the trimmable resistor 10d is cut off thus obtaining a trimmed resistor having an arbitrarily set resistance value. Depending on the starting position 8a of laser irradiation and the path of laser scanning, even though the quantity cut off as the trimming groove is the same, the resultant resistance value may be different. Therefore, it is important to carefully set the conditions.

Based on the preset thickness of the electronic component the focusing position of laser irradiation is set by the laser focus adjusting means 13 so that the laser irradiation focuses on the surface of the electronic component 10. By setting the focusing position the width 8b of the trimming groove is determined.

After image recognition of the trimmable resistor 10d and various other setting are completed, the probes 19 provided on the laser trimming head are made in contact with the electrodes of the electronic component 10 and its characteristic value such as resistance in the case of the trimmable resistor 10d is measured. Comparing the measured result with the preset resistance laser irradiation is started from the laser irradiation starting point 8a. In this case the preset resistance value is 3.9 kohm +/−0.5%.

While a laser beam is being irradiated, the resistance value of the trimmable resistor 10d continues to be measured, the laser beam moves along the laser scanning path, and cuts a trimming groove on the resistive material 10b. When the resistance value of the trimmable resistor 10d reaches the preset value of 3.9 kohm, laser irradiation is terminated.

Subsequently, the trimmed component is sucked by the suction nozzle 3 from the component supplying port 7a and mounted on the electronic circuit board 5.

A next trimmable resistor is then laser trimmed until a preset resistance value is obtained, and mounted on the electronic circuit board 5. As more than one values can be preset, it is possible to supply electronic components having different characteristic values from a single electronic components holding unit 6. Mounting of electronic components is completed by repeating this process.

By the method described above, it is possible to supply resistors having different resistance values from a single electronic components holding unit so far as the dimension of the component is the same, thereby minimizing the number of electronic component supplying cassettes and the size of the electronic components holding unit.

In the above embodiment, since an electronic component 10 is laser trimmed to an preferable characteristic value in the process of mounting the electronic component 10 from the electronic components holding unit 6 onto an electronic circuit board 5, the number of electronic component supplying cassettes 7 to be arranged on the electronic components holding unit 6 can be reduced. As an example, when the electronic component 10 is a laser trimmable chip resistor, the resistance value can be changed up to several tens of times the initial value thereby allowing to greatly reduce the number of the electronic component supplying cassettes 7. By being able to reducing the number of the electronic component supplying cassettes 7 to be arranged on the electronic components holding unit 6, it becomes unnecessary to install a large-size electronic components mounting apparatus having a large electronic components holding unit 6 or to install more than one electronic components mounting apparatus, thereby resulting in the reduction of equipment cost and the management cost of the electronic components owing to reduced number of component types as well as the management cost of the electronic component supplying cassettes 7.

For electronic components 10 other than trimmable resistors 10d such as trimmable capacitors and trimmable inductors, the capacitance or the reactance value can be changed by trimming the electrodes or the leads by laser irradiation.

Although the above description referred to mounting of an electronic component 10 only after changing its characteristic value by laser trimming, needless to say it is possible to jointly arrange in the electronic components holding unit electronic component supplying cassettes 7 carrying electronic components 10 with fixed characteristic values and mount them directly when trimming is not necessary.

INDUSTRIAL APPLICABILITY

According to the electronic components mounting method in accordance with the present invention, it is clear from the above description that by trimming electronic components to preferable characteristic values within the process of mounting them from components storing unit onto electronic circuit boards, it is possible to reduce the number of types of electronic components to be stored in the components storing unit and accordingly reduce the equipment cost and management cost of the electronic components.

Also, by laser trimming electronic components while their characteristic values are being measured or while their trimming positions are being observed through image recognition, it is possible to perform trimming without degrading the quality of the electronic components and with a good efficiency allowing it to obtain high reliability electronic circuit boards with good productivity and stability.

Also, as the electronic components mounting apparatus in accordance with the present invention is provided with a laser trimming unit to trim electronic components to preferable characteristic values, the above method of mounting can be realized in such a way that the electronic components can be trimmed to preferable characteristic values by laser trimming within the mounting process.

Also, by providing on the laser trimming unit a characteristic value measuring means, a laser oscillation means, and a laser scanning means, it is possible to laser trim electronic components while their characteristic values are being measured; and by controlling the path of laser irradiation based on the image recognized by an image pick up means, it is possible to perform trimming without the fear of mistrimming and with high reliability.

Also, by disposing the laser trimming head on the upper part of the electronic components holding unit in such a way that it can move in the direction of the arrangement of the electronic component supplying cassettes, it is possible to change the characteristic value of an electronic component to be mounted while another electronic component is being mounted by the mounting head thereby not sacrificing the productivity.

What is claimed is:

1. A method of mounting electronic components comprising the steps of:
    taking out an electronic component from an electronic components holding unit;
    mounting said electronic component onto an electronic circuit board; and
    processing said electronic component to obtain preferable characteristic values during said mounting process
    wherein said step of processing further comprises the steps of:
        obtaining an image of said electronic component;
        calculating a starting position and a scan path of a laser on said electronic component using the obtained image of said electronic component; and
        trimming said electronic component with the laser by having the laser start at said starting position and follow said scan path.

2. The method of mounting electronic components as recited in claim 1,
    wherein said electronic component is a trimmable resistor, and a resistive material of said trimmable resistor is trimmed by said laser within the processing step.

3. The method of mounting electronic components as recited in claim 1,
    wherein said electronic component is a trimmable capacitor, and a trimmable electrode of said trimmable capacitor is trimmed with said laser within the processing step.

4. The method of mounting electronic components as recited in claim 1,
    wherein said electronic component is a trimmable inductor, and a conductive part of said trimmable inductor is trimmed by said laser in the processing step.

5. The method of mounting electronic components as recited in any of claims 1 to 4,
    wherein characteristic values of said electronic components are measured while said electronic components are being trimmed to obtain preferable characteristic values.

6. The method of mounting electronic components as recited in claim 5,
    wherein probes are placed in contact with said electronic components to measure the characteristic values in the processing process.

7. An electronic components mounting apparatus comprising:
- an electronic components holding unit operable for holding therein a plurality of electronic components;
- a circuit board holder which is operable to hold an electronic circuit board;
- a mounting head which is operable to take out said electronic components from said electronic components holding unit and mount them at predetermined positions on said electronic circuit board;
- a laser trimming head which is operable to generate a laser beam to trim said electronic components to preferable characteristic values;
- an image pickup unit which is operable to pick up an image of electronic components; and
- a controller which is operable to calculate a start position and a scan path of said laser beam irradiation upon an electronic component based on the picked up image, and to control said laser trimming head to trim the electronic component to a desired value by having said laser beam irradiation start at said starting position and follow said scan path.

8. The electronic components mounting apparatus as recited in claim 7,
- further comprising probes that come in contact with said electronic components and measure characteristic values thereof while laser processing.

9. The electronic components mounting apparatus as recited in either claims 7 or 8,
- wherein the laser trimming head comprises a measuring means to measure characteristic values of electronic components, a laser oscillation means, and a laser scanning means to vary the path of laser beam irradiation.

10. The electronic components mounting apparatus as recited in any of claims 7 to 8,
- wherein the electronic components holding unit comprises a plurality electronic component supplying cassettes arranged in a line and the laser trimming head is disposed above said electronic components holding unit in such a way that it can move along the direction of the arrangement of said electronic component supplying cassettes.

11. The electronic components mounting apparatus as recited in claim 9,
- wherein the electronic components holding unit comprises a plurality electronic component supplying cassettes arranged in a line and the laser trimming head is disposed above said electronic components holding unit in such a way that it can move along the direction of the arrangement of said electronic component supplying cassettes.

12. A method of mounting electronic components comprising the steps of:
- taking out an electronic component from an electronic components holding unit by using a sucking operation provided by a suction unit;
- mounting said electronic component onto an electronic circuit board using said suction unit; and
- processing said electronic component to obtain preferable characteristic values during said mounting process
- wherein said step of processing further comprises the steps of:
  - obtaining an image of said electronic component;
  - calculating a starting position and a scan path of a laser on said electronic component using the obtained image of said electronic component; and
  - trimming said electronic component with the laser by having said laser start at said starting position and follow said scan path.

13. The method of mounting electronic components as recited in claim 12,
- wherein said electronic component is a trimmable resistor, and a resistive material of said trimmable resistor is trimmed by said laser within the processing step.

14. The method of mounting electronic components as recited in claim 12,
- wherein said electronic component is a trimmable capacitor, and a trimmable electrode of said trimmable capacitor is trimmed with said laser within the processing step.

15. The method of mounting electronic components as recited in claim 12,
- wherein said electronic component is a trimmable inductor, and a conductive part of said trimmable inductor is trimmed by said laser in the processing step.

16. The method of mounting electronic components as recited in any of claims 12 to 15,
- wherein characteristic values of said electronic components are measured while said electronic components are being trimmed to obtain preferable characteristic values.

17. The method of mounting electronic components as recited in claim 16,
- wherein probes are placed in contact with said electronic components to measure the characteristic values in the processing process.

18. The method of mounting electronic components as recited in claim 12,
- wherein the processing position of an electronic component is determined through image recognition, the starting position of laser irradiation onto said electronic component and the laser scanning path are determined in accordance with the laser trimming position of said electronic component, and said electronic component is laser trimmed.

19. An electronic components mounting apparatus comprising:
- an electronic components holding unit operable for holding therein a plurality of electronic components;
- a circuit board holder which is operable to hold an electronic circuit board;
- a mounting head having a suction unit which uses a suction to take out said electronic components from said electronic components holding unit and mount them at predetermined positions on said electronic circuit board;
- a laser trimming head which is operable to generate a laser beam to trim said electronic components to preferable characteristic values;
- an image pickup unit which is operable to pick up an image of electronic components; and
- a controller which is operable to calculate a start position and a scan path of laser beam irradiation upon an electronic component based on the picked up image, and to control said laser trimming head to trim the electronic component to a desired value by having said laser beam irradiation start at said starting position and follow said scan path.

20. The electronic components mounting apparatus as recited in claim 19,
- further comprising probes that come in contact with said electronic components and measure characteristic values thereof while laser processing.

21. The electronic components mounting apparatus as recited in either claims 19 or 20,
   wherein the laser trimming head comprises a measuring means to measure characteristic values of electronic components, a laser oscillation means, and a laser scanning means to vary the path of laser beam irradiation.

22. The electronic components mounting apparatus as recited in any of claims 19 to 20,
   wherein the electronic components holding unit comprises a plurality electronic component supplying cassettes arranged in a line and the laser trimming head is disposed above said electronic components holding unit in such a way that it can move along the direction of the arrangement of said electronic component supplying cassettes.

23. The electronic components mounting apparatus as recited in claim 21,
   wherein the electronic components holding unit comprises a plurality electronic component supplying cassettes arranged in a line and the laser trimming head is disposed above said electronic components holding unit in such a way that it can move along the direction of the arrangement of said electronic component supplying cassettes.

* * * * *